(12) United States Patent
Bui et al.

(10) Patent No.: US 8,217,717 B1
(45) Date of Patent: Jul. 10, 2012

(54) LINEAR DETECTOR WITH ADDED DIODE FEEDBACK LOOP

(75) Inventors: Hien D. Bui, Lowell, MA (US); Stephen E. Richard, Lynnfield, MA (US)

(73) Assignee: RF Micro Devices, Inc., Greensboro, NC (US)

( * ) Notice: Subject to any disclaimer, the term of this patent is extended or adjusted under 35 U.S.C. 154(b) by 39 days.

(21) Appl. No.: 12/879,198

(22) Filed: Sep. 10, 2010

(51) Int. Cl.
*H03G 3/20* (2006.01)
(52) U.S. Cl. ........................................ 330/140
(58) Field of Classification Search ............... 330/110, 330/140; 329/365, 366
See application file for complete search history.

(56) References Cited

U.S. PATENT DOCUMENTS

| | | | | |
|---|---|---|---|---|
| 3,386,042 | A * | 5/1968 | Moes | 327/50 |
| 5,291,150 | A * | 3/1994 | Saarnimo et al. | 330/279 |
| 5,796,309 | A * | 8/1998 | Nguyen | 330/289 |
| 6,265,940 | B1 * | 7/2001 | Adachi | 330/140 |

OTHER PUBLICATIONS

Fei, L.F., "Integrated Power Detector Solutions and Design Strategies," RF Design Line Magazine, Oct. 3, 2007.
"Power Amplifier Control for ETSI 11.10-Compliant Cellular Handsets," Application Note, Feb. 7, 2003, pp. 1-20, Skyworks, Inc.
"APN1014: A Level Detector Design for Dual-Band GSM-PCS Handsets," Application Note, Jul. 21, 2005, Skyworks, Inc.
Zhang, T. et al., "Bipolar Microwave RMS Power Detectors," IEEE Journal of Solid-State Circuits, Sep. 2006, pp. 2188-2192, vol. 41, No. 9, IEEE.

* cited by examiner

*Primary Examiner* — Steven J Mottola
(74) *Attorney, Agent, or Firm* — Withrow & Terranova, P.L.L.C.

(57) ABSTRACT

A linear diode detector having an increased dynamic range and an improved sensitivity level is described. The linear diode detector includes a signal input that receives a sample of output power from a power amplifier (PA). A detector output provides a voltage signal that is usable by power control circuitry to maintain a constant output power for the PA. A rectifier diode has an anode communicatively coupled to the signal input, and a cathode that is communicatively coupled to the detector output. A low pass filter is communicatively coupled to the detector output to filter out high frequency components of a rectified sample of output power. The anode of a feedback diode is communicatively coupled to the detector output, and the cathode of the feedback diode is communicatively coupled to the anode of the rectifier diode in order to feedback a portion of the voltage signal to increase detection sensitivity.

16 Claims, 6 Drawing Sheets

LINEAR DETECTOR WITH ADDED DIODE FEEDBACK LOOP

FIELD OF THE DISCLOSURE

The present disclosure relates to a linear detector that is typically used to sample a radio frequency (RF) transmitter output, and in particular to a linear detector having improved detector sensitivity for providing feedback to RF transmitter circuitry.

BACKGROUND OF THE DISCLOSURE

Gain control circuitry for a power amplifier (PA) of a mobile terminal relies on feedback from a sample of output power taken from the output of the PA. Traditionally, a relatively inexpensive linear diode detector is preferred for providing a sample of output power. Usually, a linear diode detector receives a sample of output power from a directional coupler that is in communication with the output of the PA. In order not to negatively affect a desired output power level of the PA, the directional coupler is set to a relatively low coupling factor that will just meet the sensitivity requirements of the linear diode detector. However, a linear diode detector has a poor sensitivity level of detection at a low power range. Moreover, a dynamic range of detection for a linear diode detector is relatively narrow. Prior art linear diode detectors will not meet the present dynamic range requirements after taking into consideration control loop gain and potential transceiver implementation for second generation (2G) detectors used in mobile terminals such as cellular phones. This difficulty is mostly due to the fact that present requirements for 2G detectors require a nearly 40 dB dynamic range. As a result of such stringent requirements, a need remains for a linear diode detector having an increased dynamic range of detection as well as an improved sensitivity level of detection.

SUMMARY OF THE DISCLOSURE

The present disclosure describes a linear diode detector having an increased dynamic range of detection as well as an improved sensitivity level of detection. In general, the linear diode detector of the present disclosure includes a signal input that receives a sample of output power being outputted from a power amplifier (PA). The sample of output power is usually taken from a port of a directional coupler. Only a relatively small portion of the output power is tapped as input into the linear diode detector. A majority of the output power is transferred through the directional coupler to a load such as an antenna.

The linear diode detector also has a detector output that provides a voltage signal that is usable by power control circuitry to maintain a constant output power for the PA. While signals envisaged as input into the linear diode detector of the present disclosure are radio frequency (RF) signals, the linear diode detector of the present disclosure may also have applications as an audio envelope detector.

The linear diode detector also includes a rectifier diode that has an anode that is communicatively coupled to the signal input, and a cathode that is communicatively coupled to the detector output. The rectifier diode removes negative excursions of the sample of output RF voltage. A low pass filter that is communicatively coupled to the detector output is usable to filter out high frequency components of the sample of output RF voltage. In this way, only relatively low frequency components of the sample of output RF voltage remain for input into the power control circuitry.

A feedback diode provides a feedback of the voltage signal at the detector output to the anode of the rectifier diode to improve the sensitivity and dynamic range of the linear diode detector. In order to provide the feedback of the voltage signal, the anode of the feedback diode is communicatively coupled to the detector output, and the cathode of the feedback diode is communicatively coupled to the anode of the rectifier diode.

Other features such as a bias network and a temperature compensating diode are also included and disclosed in greater detail in a detailed description of the preferred embodiments found below. Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
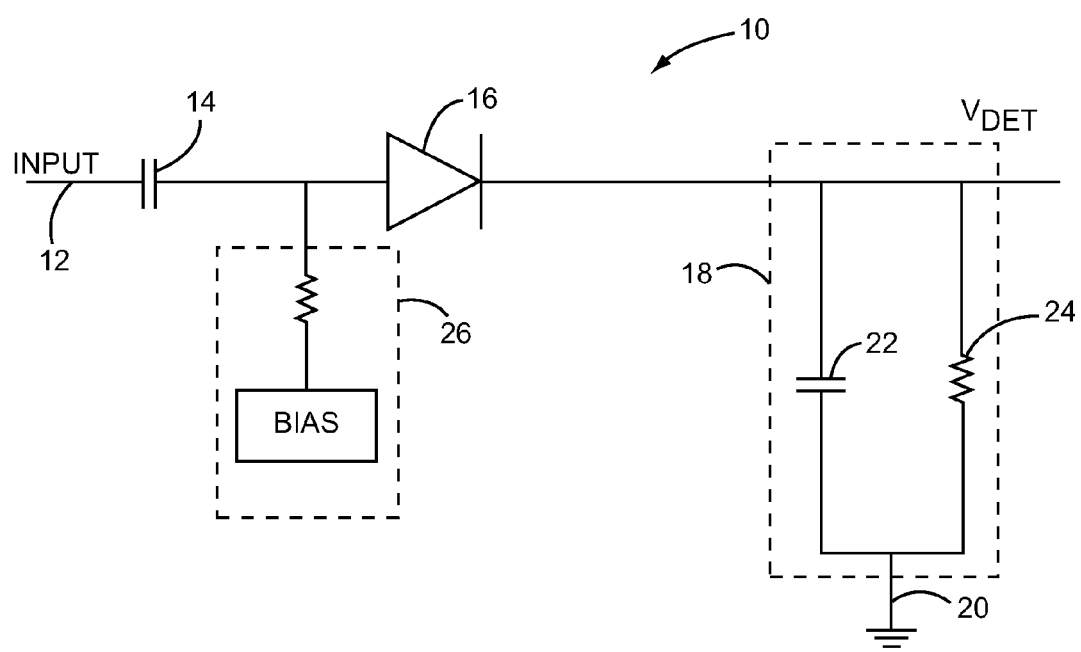
FIG. 1 is a circuit diagram for a single diode detector according to the prior art.

FIG. 1 is a circuit diagram for a linear diode detector 10 according to the prior art. The linear diode detector 10 has a signal input 12. A direct current (DC) blocking capacitor 14 has a first terminal coupled to the signal input 12 and a second terminal coupled to an anode of a rectifier diode 16. A cathode of the rectifier diode 16 provides an output for a detector voltage ($V_{DET}$). A low pass filter 18 is coupled between the cathode of the rectifier diode 16 and a ground node 20. The low pass filter comprises a filter capacitor 22 and a filter resistor 24 that are coupled in parallel. A bias network 26 provides a DC level for moving an operating point of the rectifier diode 16 to near a forward conduction region of the rectifier diode 16.

Figure 2:
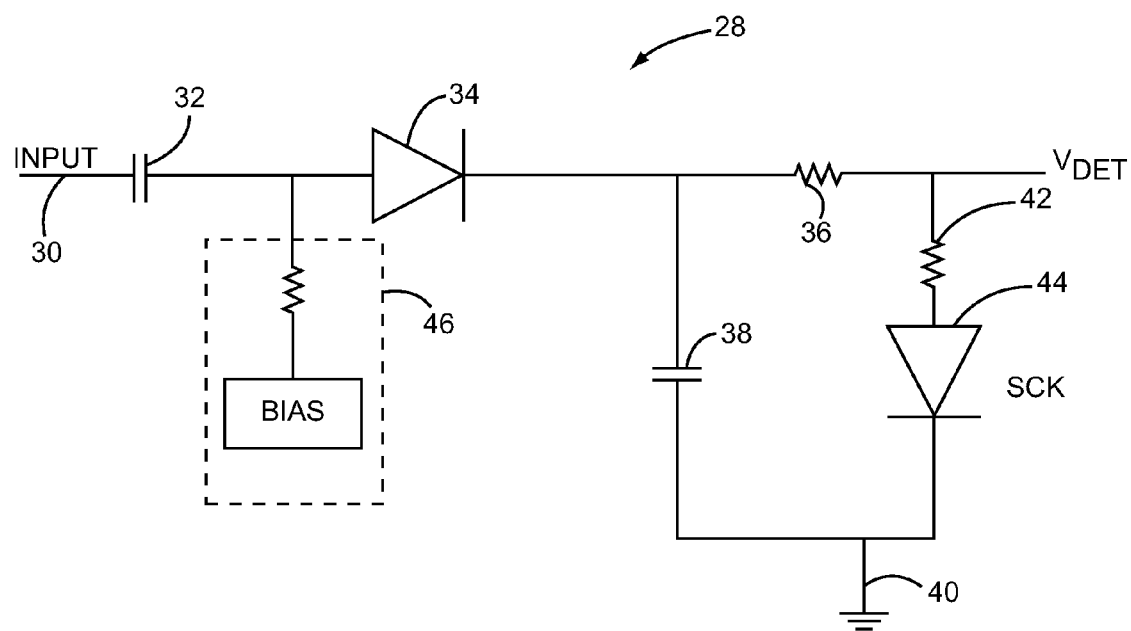
FIG. 2 is a circuit diagram for a temperature compensated dual diode detector according to the prior art.

FIG. 2 is a circuit diagram for a linear diode detector 28 that is temperature compensated according to the prior art. The linear diode detector 28 has a signal input 30. A DC blocking capacitor 32 has a first terminal coupled to the signal input 30 and a second terminal coupled to an anode of a rectifier diode 34. A cathode of the rectifier diode 34 is coupled to a first terminal of an output resistor 36 that has a second terminal that provides an output for a $V_{DET}$. A filter capacitor 38 is coupled between the cathode of the rectifier diode 34 and a ground node 40. A filter resistor 42 has a first terminal and a second terminal, wherein the first terminal is coupled to the second terminal of the output resistor 36. The filter resistor 42 and the filter capacitor 38 are in a parallel configuration that makes up a low pass filter for filtering high frequency components from a rectified signal comprising $V_{DET}$.

A temperature compensating diode 44 has an anode coupled to the second terminal of the filter resistor 42 and a cathode that is coupled to the ground node 40. The temperature compensating diode 44 has a temperature coefficient that is usable to negate temperature shifts in the level of $V_{DET}$ caused by operating point drifts of the rectifier diode 34 under changing ambient temperature conditions. A bias network 46 provides a DC level for moving an operating point of the rectifier diode 34 to near a forward conduction region of the rectifier diode 34.

Figure 3:
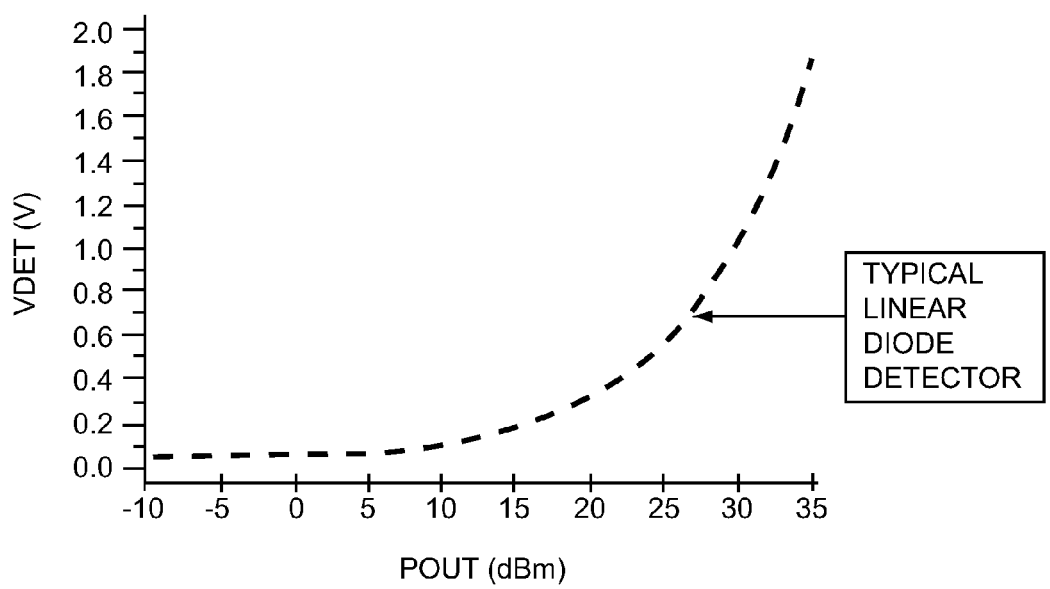
FIG. 3 is a graph of simulated detector voltage ($V_{DET}$) versus output power for a prior art linear diode detector.

FIG. 3 is a graph of simulated $V_{DET}$ versus output power ($P_{OUT}$) for a prior art linear diode detector such as the linear diode detector 10 (FIG. 1). The output power in this case is the power at the output of a 2G PA. A simulation that generated the $V_{DET}$ versus $P_{OUT}$ data included an electromagnetic (EM) simulated directional coupler placed on a PA output terminal to sample $P_{OUT}$. Following the dashed curve, notice that at a $P_{OUT}$ of less than 10 dBm, the sensitivity of the typical linear diode detector is undesirably low, being only about 8 mV/dB at 10 dBm. Moreover, the sensitivity is practically flat for a $P_{OUT}$ of less than about 5 dBm. As a result, typical linear diode detectors are not practical at $P_{OUT}$ levels of less than about 5 dBm.

Figure 4:
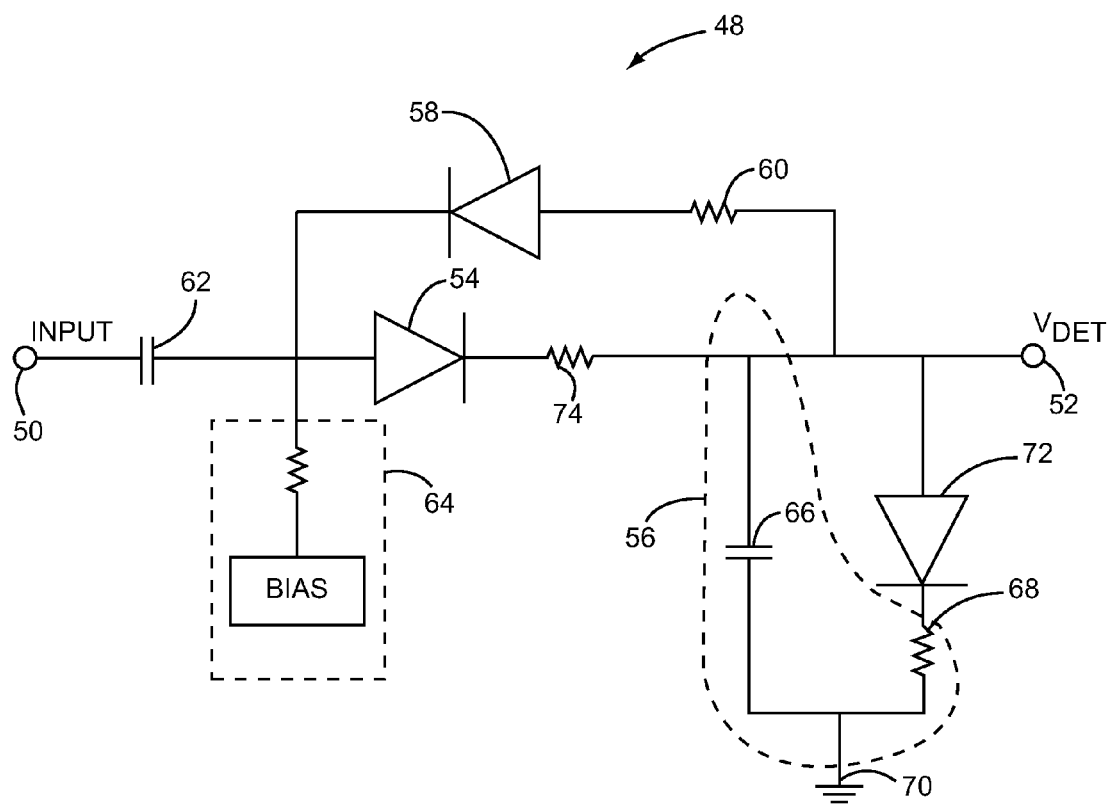
FIG. 4 is a circuit diagram for a linear diode detector with a diode feedback loop according to the present disclosure.

FIG. 4 is a circuit diagram for a linear diode detector 48, which in accordance with the present disclosure increases sensitivity to usable levels for a $P_{OUT}$ as low as −10 dBm. The linear diode detector 48 has a signal input 50 and a detector output 52. The linear diode detector 48 includes a rectifier diode 54 having an anode and a cathode, wherein the anode of the rectifier diode 54 is communicatively coupled to the signal input 50, and wherein the cathode of the rectifier diode 54 is communicatively coupled to the detector output 52. A low pass filter 56 is communicatively coupled to the detector output 52. A feedback diode 58 having an anode and cathode is adapted to provide a feedback current from the detector output 52 to the anode of the rectifier diode 54. The anode of the feedback diode 58 is communicatively coupled to the detector output 52, whereas the cathode of the feedback diode 58 is communicatively coupled to the anode of the rectifier diode 54. A means for limiting feedback is preferably a feedback limiting resistor 60 that is placed in series with the feedback diode 58. While the feedback limiting resistor 60 is shown in FIG. 4 as being coupled between the anode of the feedback diode 58 and the detector output 52, the feedback limiting resistor 60 can also be coupled between the cathode of the feedback diode 58 and the anode of the rectifier diode 54.

Preferably, the linear diode detector 48 also includes a DC blocking capacitor 62 and a bias network 64. The bias network 64 is coupled to the anode of the rectifier diode 54 to inject a DC current into the rectifier diode 54 in order to move an operating point of the rectifier diode 54 to near a forward conduction region of the rectifier diode 54. The DC blocking capacitor 62 has a first terminal coupled to the signal input 50 and a second terminal coupled to the anode of the rectifier diode 54. The DC blocking capacitor 62 prevents DC current provided by the bias network 64 from flowing into the signal input 50.

The low pass filter 56 is preferably made up of a filter capacitor 66 and a filter resistor 68 that are communicatively coupled in parallel between the detector output 52 and a fixed voltage node 70. The fixed voltage node 70 is typically at a ground potential.

It is preferred that the linear diode detector 48 also include a temperature compensating diode 72 to reduce temperature-induced voltage level shifts of $V_{DET}$. The temperature compensating diode 72 is preferably placed in series with the filter resistor 68. A temperature compensation trimmer resistor 74 may be placed in series with the rectifier diode 54 in order to create a voltage divider effect between the rectifier diode 54, the temperature compensating diode 72, and the filter resistor 68. In this way, a thermal response urged by a temperature coefficient of the rectifier diode 54 can be more closely matched to a thermal response urged by the temperature coefficient of the temperature compensating diode 72. Moreover, it is preferred that the temperature compensating diode 72 also be a Schottky diode having physical characteristics such a size closely matched to the physical characteristics of the rectifier diode 54. The temperature coefficient of the temperature compensating diode 72 is usable to negate temperature shifts in the level of $V_{DET}$ caused by operating point drifts of the rectifier diode 54 under changing ambient temperature conditions.

Figure 5:
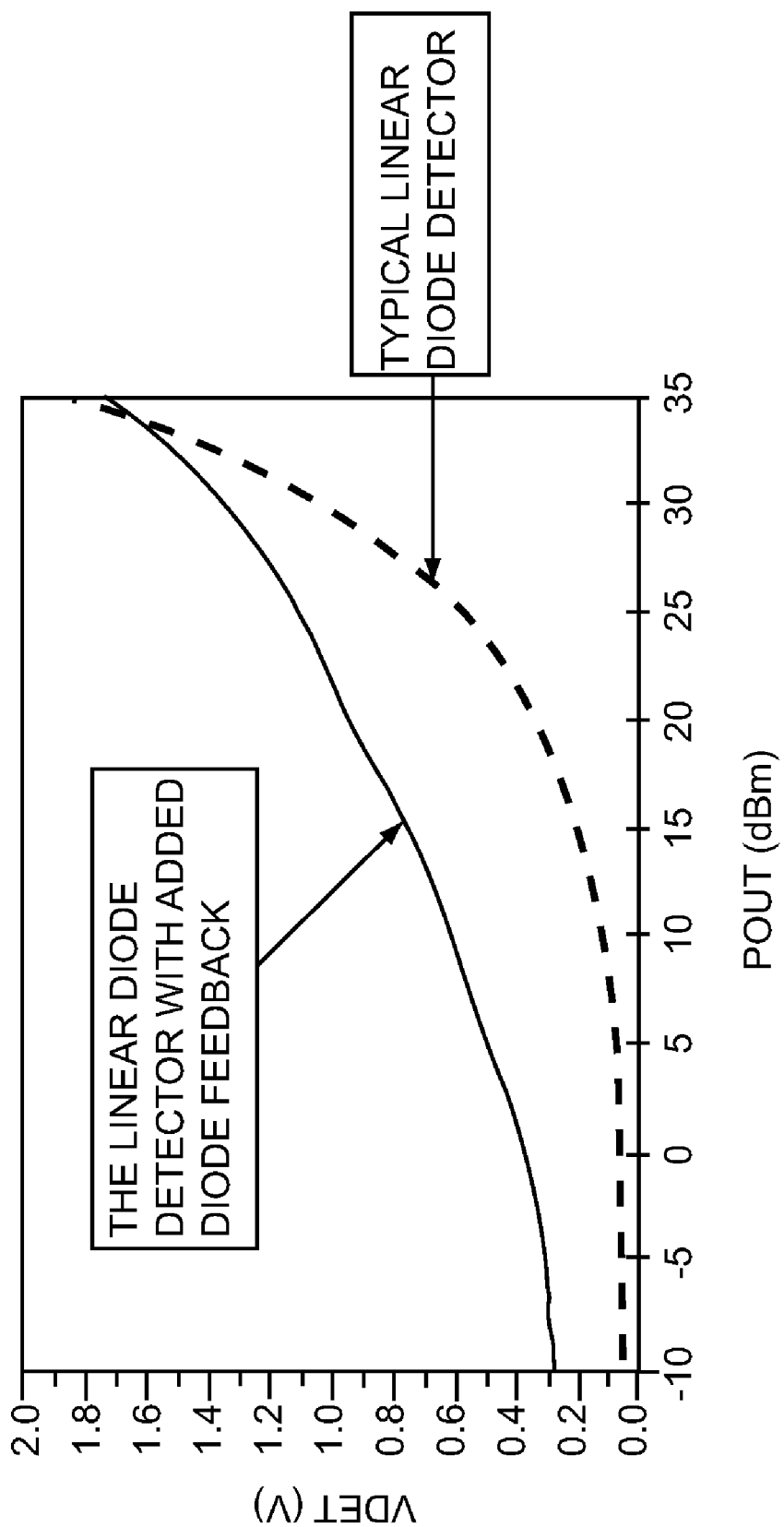
FIG. 5 is a graph of simulated $V_{DET}$ outputted by a linear diode detector with and without a diode feedback loop.

FIG. 5 is a graph of simulated $V_{DET}$ versus $P_{OUT}$ (dashed curve) for a typical linear diode detector compared to $V_{DET}$ versus $P_{OUT}$ (solid curve) for the linear diode detector 48 (FIG. 4). The linear diode detector 48 with added diode feedback has significantly higher sensitivity at lower $P_{OUT}$ levels in comparison to a typical linear diode such as the linear diode detector 28, which does not include added diode feedback. For example, at 5 dBm the $V_{DET}$ versus $P_{OUT}$ slope for a typical linear diode such as the linear diode detector 28 is about 5 mV/dB, whereas the $V_{DET}$ at 5 dBm for the linear diode detector 48 with added diode feedback is about 20 mV/dB. The greatest difference in performance between a typical linear diode detector and the linear diode detector 48 is that the linear diode detector 48 has a far superior dynamic range. This is most significant in the area of −10 to 0 dBm, which is critical for the operation of modern 2G cellular telephones for purposes of power control and is graphically depicted in FIG. 5. The detection of the linear diode detector 28 is limited at 0 dBm, whereas the detection of the linear diode detector 48 can be extended to −10 dBm.

The linear diode detector 48 is preferably constructed monolithically as an integrated circuit. As such, the area of the feedback diode 58 can be carefully controlled during a layout of the devices making up the linear diode detector 48. It has been found that varying the area of the feedback diode 58 affects the linearity of the $V_{DET}$ versus $P_{OUT}$ curve for the linear diode detector 48. It has also been found that operating points along the $V_{DET}$ versus $P_{OUT}$ curve can be controlled by the amount of resistance chosen for the feedback limiting resistor 60 (FIG. 4).

Figure 6:
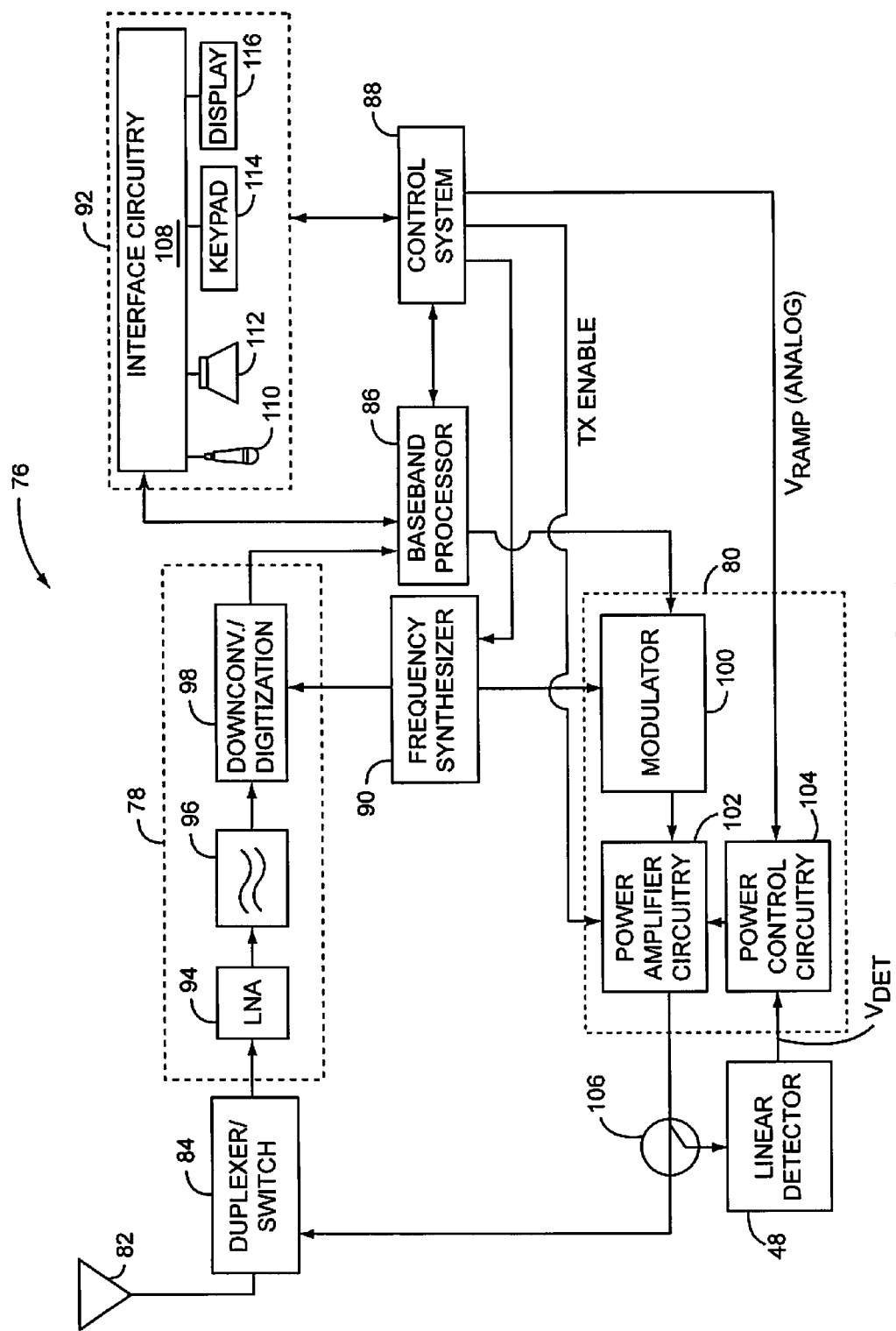
FIG. 6 is a diagram representing the basic architecture of a mobile terminal that incorporates the linear diode detector of the present disclosure.

The linear detector diode 48 of the present disclosure is preferably incorporated in a mobile terminal 76, such as a mobile telephone, personal digital assistant (PDA), personal computer, or the like. The basic architecture of a mobile terminal 76 is represented in FIG. 6 and may include a receiver front end 78, an RF transmitter section 80, an antenna 82, a duplexer or switch 84, a baseband processor 86, a control system 88, a frequency synthesizer 90, and an interface 92.

The receiver front end 78 receives information bearing RF signals from one or more remote transmitters provided by a base station. A low noise amplifier 94 amplifies an RF signal captured by the antenna 82. A filter circuit 96 minimizes broadband interference in the received RF signal, while a downconverter 98 downconverts the filtered, received RF signal to an intermediate or baseband frequency signal, which is then digitized into one or more digital streams. The receiver front end 78 typically uses one or more mixing frequencies generated by the frequency synthesizer 90.

The baseband processor 86 processes the digitized received signal to extract the information or data bits conveyed in the received signal. This processing typically comprises demodulation, decoding, and error correction operations. As such, the baseband processor 86 is generally implemented in one or more digital signal processors (DSPs).

On the transmit side, the baseband processor 86 receives digitized data from the control system 88, which it encodes for transmission. The encoded data is output to the radio frequency transmitter section 80, where it is used by a modulator 100 to modulate a carrier signal that is at a desired transmit frequency. PA circuitry 102 amplifies the modulated carrier signal to a level appropriate for transmission to the antenna 82. The PA circuitry 102 provides gain for the signal to be transmitted under control of power control circuitry 104, which is preferably controlled by the control system 88 using an adjustable power control signal ($V_{RAMP}$). Further still, a directional coupler 106 samples output power from the power amplifier circuitry 102 and provides a small sample of the output power to the linear diode detector 48, which in turn provides the $V_{DET}$ signal to the power control circuitry 104. The directional coupler 106 provides around 15 dB of coupling for transmitter high band (HB) frequencies and around 20 dB of coupling for transmitter low band (LB) frequencies.

As a result of providing the $V_{DET}$ signal from the linear diode detector 48 to the power control circuitry 104, the bias for the power amplifier circuitry 102 is adjusted to maintain a desired output power under varying conditions, such as decreasing battery voltage and/or fluctuating voltage standing wave ratio (VSWR), etc. The control system 88 may also provide a transmit enable signal (TX ENABLE) to effectively enable the PA circuitry 102 during periods of transmission.

A user may interact with the mobile terminal 76 via the interface 92, which may include interface circuitry 108 associated with a microphone 110, a speaker 112, a keypad 114, and a display 116. The interface circuitry 108 typically includes analog-to-digital converters, digital-to-analog converters, amplifiers, and the like. Additionally, the interface circuitry 108 may include a voice encoder/decoder, in which case it may communicate directly with the baseband processor 86.

The microphone 110 will typically convert audio input, such as the user's voice, into an electrical signal, which is then digitized and passed directly or indirectly to the baseband processor 86. Audio information encoded in the received signal is recovered by the baseband processor 86 and converted into an analog signal suitable for driving the speaker 112 and the interface circuitry 108. The keypad 114 and the display 116 enable the user to interact with the mobile terminal 76, inputting numbers to be dialed, address book information, or the like, as well as monitoring call progress information.

Those skilled in the art will recognize improvements and modifications to the preferred embodiments of the present disclosure. All such improvements and modifications are considered within the scope of the concepts disclosed herein and the claims that follow.

What is claimed is:

1. A linear diode detector comprising:
   a signal input;
   a detector output;
   a rectifier diode having an anode and a cathode, wherein the anode of the rectifier diode is communicatively coupled to the signal input and the cathode of the rectifier diode is communicatively coupled to the detector output;
   a low pass filter communicatively coupled to the detector output;
   a feedback diode having an anode and a cathode, wherein the anode of the feedback diode is communicatively coupled to the detector output and the cathode of the feedback diode is communicatively coupled to the anode of the rectifier diode; and
   a feedback limiting resistor in series with the feedback diode.

2. The linear diode detector of claim 1 wherein the feedback diode is a Schottky diode.

3. The linear diode detector of claim 1 wherein the rectifier diode is a Schottky diode.

4. The linear diode detector of claim 1 wherein the anode of the rectifier diode is coupled to the signal input through a direct current (DC) blocking capacitor.

5. The linear diode detector of claim 1 further including a bias network coupled to the anode of the rectifier diode to inject a DC current into the rectifier diode.

6. The linear diode detector of claim 1 wherein the low pass filter comprises a filter capacitor in parallel with a filter resistor.

7. The linear diode detector of claim 6 further including a temperature compensating diode that is in series with the filter resistor.

8. The linear diode detector of claim 7 wherein the temperature compensating diode is a Schottky diode.

9. A mobile terminal comprising:
   a power amplifier (PA) having an output and a control input;
   a directional coupler having an input and an output, wherein the input of the directional coupler is communicatively coupled to the output of the PA;
   a linear diode detector comprising:
      a signal input communicatively coupled to the output of the directional coupler;
      a detector output;
      a rectifier diode having an anode and a cathode, wherein the anode of the rectifier diode is communicatively coupled to the signal input and the cathode of the rectifier diode is communicatively coupled to the detector output;
      a low pass filter communicatively coupled to the detector output;
      a feedback diode having an anode and a cathode, wherein the anode of the feedback diode is communicatively coupled to the detector output and the cathode of the feedback diode is communicatively coupled to the anode of the rectifier diode;
      a feedback limiting resistor in series with the feedback diode; and
   a control circuitry having an input and output, wherein the input of the control circuitry is communicatively coupled to the detector output of the linear diode detector and the output of the control circuitry is communicatively coupled to the control input of the PA.

10. The mobile terminal of claim 9 wherein the feedback diode is a Schottky diode.

11. The mobile terminal of claim 9 wherein the rectifier diode is a Schottky diode.

12. The mobile terminal of claim 9 wherein the anode of the rectifier diode is coupled to the signal input through a DC blocking capacitor.

13. The mobile terminal of claim 9 further including a bias network coupled to the anode of the rectifier diode to inject a DC current into the rectifier diode.

14. The mobile terminal of claim 9 wherein the low pass filter comprises a filter capacitor in parallel with a filter resistor.

15. The mobile terminal of claim 14 further including a temperature compensating diode that is in series with the filter resistor.

16. The mobile terminal of claim 15 wherein the temperature compensating diode is a Schottky diode.

* * * * *